US008151220B2

(12) United States Patent
Hess et al.

(10) Patent No.: US 8,151,220 B2
(45) Date of Patent: Apr. 3, 2012

(54) METHODS FOR SIMULATING RETICLE LAYOUT DATA, INSPECTING RETICLE LAYOUT DATA, AND GENERATING A PROCESS FOR INSPECTING RETICLE LAYOUT DATA

(75) Inventors: Carl Hess, Los Altos, CA (US); Yalin Xiong, Union City, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 1723 days.

(21) Appl. No.: 11/003,291

(22) Filed: Dec. 3, 2004

(65) Prior Publication Data

US 2006/0051682 A1 Mar. 9, 2006

Related U.S. Application Data

(60) Provisional application No. 60/526,881, filed on Dec. 4, 2003.

(51) Int. Cl.
*G06F 17/50* (2006.01)
*G06F 11/22* (2006.01)

(52) U.S. Cl. ........................................... 716/51; 716/136
(58) Field of Classification Search .............. 716/10–11, 716/21, 19, 4–5, 51, 136
See application file for complete search history.

(56) References Cited

U.S. PATENT DOCUMENTS

| | | | |
|---|---|---|---|
| 6,529,621 B1 | 3/2003 | Glasser et al. | |
| 6,748,103 B2 | 6/2004 | Glasser | |
| 6,803,554 B2 | 10/2004 | Ye et al. | |
| 6,807,503 B2 | 10/2004 | Ye et al. | |
| 2003/0086081 A1* | 5/2003 | Lehman | 356/237.1 |
| 2003/0226951 A1 | 12/2003 | Ye et al. | |
| 2004/0098216 A1 | 5/2004 | Ye et al. | |
| 2004/0133369 A1* | 7/2004 | Pack et al. | 702/59 |

OTHER PUBLICATIONS

Garcia et al., "New Die to Database Inspection Algorithm for Inspection of 90-nm Node Reticles," Proceedings of SPIE, vol. 5130, 2003, pp. 364-374.
Pang et al., "Simulation-based Defect Printability Analysis on Alternating Phase Shifting Masks for 193 nm Lithography," Proceedings of SPIE, vol. 4889, 2002, pp. 947-954.
Lu et al., "Application of Simulation Based Defect Printability Analysis for Mask Qualification Control," Proceedings of SPIE, vol. 5038, 2003, pp. 33-40.
International Search Report, PCT/US2004/040733, mailed Dec. 23, 2005.

* cited by examiner

*Primary Examiner* — Suresh Memula
(74) *Attorney, Agent, or Firm* — Ann Marie Mewherter

(57) ABSTRACT

Various computer-implemented methods are provided. One method for generating a process for inspecting reticle layout data includes identifying a first region in the reticle layout data. A printability of the first region is more sensitive to changes in process parameters than a printability of a second region in the reticle layout data. The method also includes assigning one or more inspection parameters to the first region and the second region such that the first region will be inspected during the process with a higher sensitivity than the second region. Another method includes inspecting the first region with a higher sensitivity than the second region. An additional method includes simulating how the reticle layout data will print. Simulation of the first and second regions is performed with one or more different simulation parameters such that the first region is simulated with a higher fidelity than the second region.

23 Claims, 4 Drawing Sheets

| Region | Inspection Parameters |
|---|---|
| First region | High Sensitivity Algorithm |
| Second region | Low Sensitivity Algorithm |
| ⋮ | ⋮ |

METHODS FOR SIMULATING RETICLE LAYOUT DATA, INSPECTING RETICLE LAYOUT DATA, AND GENERATING A PROCESS FOR INSPECTING RETICLE LAYOUT DATA

PRIORITY CLAIM

This application claims priority to U.S. Provisional Application No. 60/526,881 entitled "Designer Intent," filed Dec. 4, 2003, which is incorporated by reference as if fully set forth herein.

BACKGROUND OF THE INVENTION

1. Field of the Invention

The present invention generally relates to computer-implemented methods for simulating reticle layout data, inspecting reticle layout data, and generating a process for inspecting reticle layout data. Certain embodiments relate to a computer-implemented method that includes identifying a first region in reticle layout data that has a printability that is more sensitive to changes in process parameters than a printability of a second region in the reticle layout data.

2. Description of the Related Art

The following description and examples are not admitted to be prior art by virtue of their inclusion in this section.

Designing an integrated circuit (IC) involves creating a schematic design that includes individual devices arranged and coupled to perform a particular function. As ICs become increasingly complex, the design of the ICs also increases in complexity. For example, ICs are generally designed to have smaller dimensions and greater circuit density to improve the speed and other characteristics of the ICs.

The IC design may be developed using any method or system known in the art such as electronic design automation (EDA), computer aided design (CAD), and other IC design software. Such methods and systems may be used to generate the circuit pattern database from the IC design. The circuit pattern database includes data representing a plurality of layouts for various layers of the IC. Data representing the layouts of the various IC layers may be used to determine layouts for a plurality of reticles. Reticles or "masks" are used in a lithography process to transfer a pattern to a resist on a wafer. The terms "reticle" and "mask" are used interchangeably herein.

The layout of a reticle generally includes a plurality of polygons that define features in a pattern on the reticle. Typically, these polygons can be generally defined by their size and placement of the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

In particular, the reticle is used to pattern a resist in a lithography process step, and then the patterned resist is used to form features of the IC on the wafer. Therefore, the patterned features that are formed on a reticle and are to be transferred to the wafer reflect the characteristics of the features that are included in the IC design. In other words, the features that are formed on the reticle may be based on and are used to form individual components of the ICs such as those described above. The complexity of the IC design, therefore, has a direct impact on the manufacture and inspection of reticles.

Accordingly, as the complexity of the IC design increases, successful reticle manufacture becomes more difficult. For instance, as the dimensions of the IC features and the spacings between the features decrease, the dimensions and spacings of features on the reticle also decrease. In this manner, it becomes more difficult to form these features on a reticle due to, for example, limitations of the reticle manufacturing process. In addition, it becomes more difficult to inspect these features due to limitations of the reticle inspection processes. Furthermore, as is known in the art, the difficulty of successfully reproducing these features on wafers increases as the dimensions and spacings decrease.

Due to the important role that reticles play in semiconductor fabrication, ensuring that the reticles have been manufactured satisfactorily (such that the reticles can be used to produce the desired images on wafers) is critical to successful semiconductor fabrication. In general, during a reticle inspection process, the optical image of the reticle is typically compared to a baseline image. The baseline image is either generated from the circuit pattern data or from an adjacent die on the reticle itself. Either way, the optical image features are analyzed and compared with corresponding features of the baseline image. Each feature difference is then compared against a single threshold value. If the optical image feature varies from the baseline feature by more than the predetermined threshold, a defect may be defined.

Although conventional reticle inspections provide adequate levels of detection accuracy for some applications, other applications require a higher sensitivity or lower threshold value (for identifying defects) while yet other applications require less stringent, higher threshold levels. Since conventional inspections analyze all features of a given type of reticle with the same threshold and analysis algorithm, some features are inspected too stringently while others are not inspected stringently enough.

Electrically critical features of an IC typically include gates of the semiconductor transistor devices. That is, a gate width on the reticle needs to produce a corresponding gate width on the circuit pattern within a relatively small margin of error in order for the fabricated IC device to function properly. If the threshold is set too high, these critical gate areas are not checked adequately enough. Conversely, other features, such as the widths of the interconnections between gate areas, do not affect the function of the IC as much as the gate area width and, thus, do not need to be inspected as stringently as other features. If the threshold is set too low, too many of these non-critical features may be defined as defects such that the inspection results are difficult to interpret and/or computational resources are overloaded.

In sum, therefore, conventional inspection systems waste valuable resources by inspecting regions of the reticle too stringently, and not reliably inspecting other regions stringently enough. In other words, the above described inspection system fails to reliably detect defects within electrically critical areas and inefficiently inspects electrically non-critical regions where somewhat larger defects will not present a problem. Conventional inspection systems and techniques are unable to distinguish between electrically critical and non-critical areas of the reticle. Put in another way, conventional design documentation (e.g., electronic reticle or integrated circuit information) fails to adequately transmit the IC designer's intent regarding the circuit tolerance and resulting IC device dimensions to reticle writer systems, reticle inspection systems, and ultimately wafer inspection systems.

For at least these reasons, some inspection methods have been developed that inspect reticles with varying stringency based on the intent of the IC designer. Examples of such methods are illustrated in U.S. Pat. Nos. 6,529,621 to Glasser et al. and 6,748,103 to Glasser et al., which are incorporated by reference as if fully set forth herein. In this manner, decisions as to the appropriate stringency that should be used to detect defects on reticles can be made based on the electrical significance of features in the reticle layout data.

Such methods have substantially improved the accuracy, meaningfulness, usefulness, and throughput of reticle inspection. However, such methods do not take into account a number of other variables of the reticle layout data that can be used to further increase the value of the reticle inspection. For example, designer intent based inspection methods do not consider the printability of reticle layout data when determining an appropriate stringency for the data. In particular, various characteristics of the reticle layout data such as dimension among others will determine how difficult it will be to accurately print or reproduce the reticle layout data as desired. One way to define the difficulty of accurately printing reticle layout data is by the process window for the reticle layout data (e.g., reticle layout data having a narrow process window will be more difficult to print than reticle layout data having a large process window). As such, it may be desirable to more stringently inspect regions of the reticle layout data that are more difficult to print than regions of the reticle layout data that are less difficult to print. Although some electrically significant areas of an IC may also be difficult to print, currently used reticle inspection methods do not adjust the stringency of the reticle inspection method based on the printability of different regions of the reticle layout data.

Accordingly, it may be advantageous to develop methods that can be used to generate a process for inspecting reticle layout data, to inspect reticle layout data, and/or to simulate reticle layout data while taking into account the printability of various regions of the reticle layout data.

SUMMARY OF THE INVENTION

An embodiment of the invention relates to a computer-implemented method for generating a process for inspecting reticle layout data. The method includes identifying a first region in the reticle layout data. A printability of the first region is more sensitive to changes in process parameters than a printability of a second region in the reticle layout data. In one embodiment, the first region may have an area approximately equal to an area of one feature in the reticle layout data. The method also includes assigning one or more inspection parameters to the first region and the second region such that the first region will be inspected during the process with a higher sensitivity than the second region.

The printability of the first and second regions may be the printability of the first and second regions on a reticle. In this embodiment, the process parameters include reticle manufacturing process parameters. Alternatively, the printability of the first and second regions is the printability of the first and second regions on a wafer. In this embodiment, the process parameters include reticle manufacturing process parameters and wafer manufacturing process parameters.

In another embodiment, the printability of the first region is more sensitive to the changes in the process parameters in that the first region has a narrower process window than the second region. In an additional embodiment, the printability of the first region may be more sensitive to the changes in the process parameters in that the first region has a higher mask error enhancement factor (MEEF) than the second region.

In some embodiments, the method may also include generating a review process for the reticle layout data. Generating the review process may include assigning one or more review parameters to the first region and the second region such that the first region will be reviewed during the review process with a higher sensitivity than the second region. Each of the embodiments of the method described above may include any other step(s) described herein.

Another embodiment relates to a computer-implemented method for inspecting reticle layout data. This method includes identifying a first region in the reticle layout data. A printability of the first region is more sensitive to changes in process parameters than a printability of a second region in the reticle layout data. In one embodiment, the first region may have an area approximately equal to an area of one feature in the reticle layout data. The method also includes inspecting the first region with a higher sensitivity than the second region.

In one embodiment, the printability of the first and second regions is the printability of the first and second regions on the reticle. In this embodiment, the process parameters may include reticle manufacturing process parameters. In a different embodiment, the printability of the first and second regions is the printability of the first and second regions on a wafer. In this embodiment, the process parameters include reticle manufacturing process parameters and wafer manufacturing process parameters.

In some embodiments, the printability of the first region is more sensitive to the changes in the process parameters in that the first region has a narrower process window than the second region. In another embodiment, the printability of the first region is more sensitive to the changes in the process parameters in that the first region has a higher MEEF than the second region.

In one embodiment, inspecting the first and second regions includes detecting printing defects that will be produced by the first and second regions of the reticle layout data. In another embodiment, inspecting the first and second regions may be performed prior to manufacturing of a reticle with the reticle layout data. In this embodiment, the method may include altering the reticle layout data based on results of the inspection. In an additional embodiment, the method may include determining how sensitive a printability of each region of the reticle layout data is to the changes in the process parameters. In this embodiment, inspecting the first and second regions may include inspecting each region of the reticle layout data with a sensitivity based on the sensitivity of the printability of each region. Each of the embodiments of the method described above may include any other step(s) described herein.

An additional embodiment relates to a method for simulating reticle layout data. This method includes identifying a first region in the reticle layout data. A printability of the first region is more sensitive to changes in process parameters than a printability of a second region in the reticle layout data. This method also includes simulating how the reticle layout data will print. Simulation of the first region and the second region is performed with one or more different simulation parameters such that the first region is simulated with a higher fidelity than the second region.

In one embodiment, the printability of the first and second regions is the printability of the first and second regions on a reticle. In this embodiment, the process parameters include reticle manufacturing process parameters. In other embodiments, the printability of the first and second regions is the printability of the first and second regions on a wafer. In such embodiments, the process parameters include reticle manufacturing process parameters and wafer manufacturing process parameters.

In some embodiments, simulating how the reticle layout data will print may include simulating how the reticle layout data will print with different process parameters. In such embodiments, the one or more different simulation parameters may include higher sampling of the different process parameters for the first region than for the second region. In another embodiment, the one or more different simulation parameters may include a larger number of pixels for the first region than the second region.

The method may also include detecting printing defects that will be produced by the reticle layout data based on the simulation. In addition, the method may include altering the reticle layout data based on the simulation. Furthermore, the method may include simulating an entirety of the reticle layout data. Each of the embodiments of the method described above may include any other step(s) described herein.

Further embodiments relate to a carrier medium that includes program instructions executable on a computer system to perform any of the computer-implemented methods described herein. Additional embodiments relate to a system configured to perform any of the computer-implemented methods described herein. The system may include a processor configured to execute program instructions for performing one or more of the computer-implemented methods described herein. In one embodiment, the system may be a stand-alone system. In another embodiment, the system may be a part of or coupled to an inspection system. In a different embodiment, the system may be a part of or coupled to a defect review system. In yet another embodiment, the system may be coupled to a fab database. The system may be coupled to an inspection system, a review system, or a fab database by a transmission medium such as a wire, a cable, a wireless transmission path, and/or a network. The transmission medium may include "wired" and "wireless" portions.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
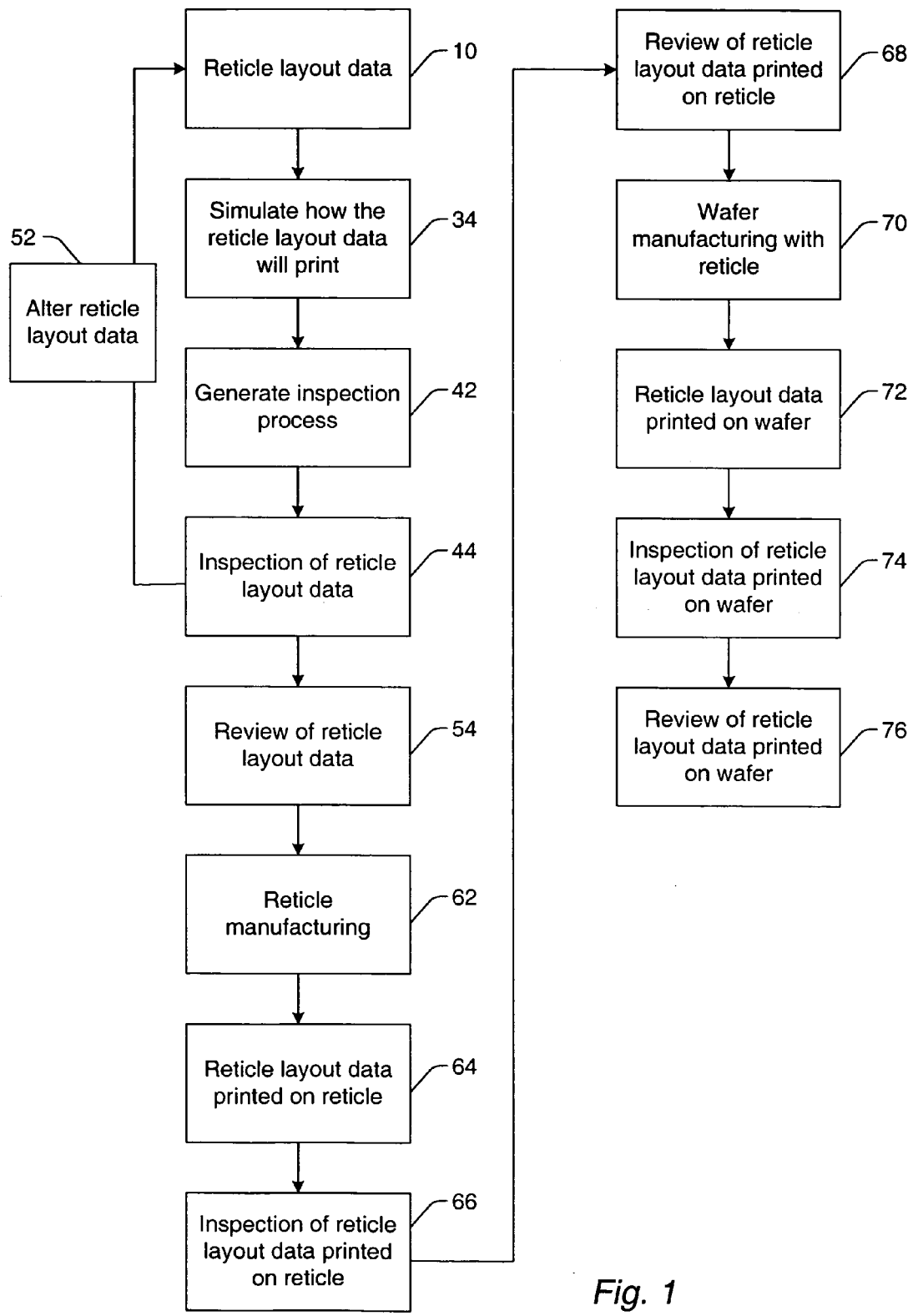
FIG. 1 is a flow chart illustrating one example of a method, several steps of which may be performed according to embodiments described herein.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "reticle" and "mask" are used interchangeably herein. A reticle generally includes a transparent substrate such as glass, borosilicate glass, and fused silica having a layer of opaque material formed thereon. A reticle may include additional materials formed under the opaque material such as an adhesion layer. In addition, a reticle may include additional materials formed on top of the opaque material such as a bottom anti-reflective coating, a resist (or "photoresist"), and a top anti-reflective layer. The opaque regions may be replaced by regions etched into the transparent substrate.

Many different types of reticles are known in the art, and the term reticle as used herein is intended to encompass all types of reticles. For example, the term reticle refers to different types of reticles including, but not limited to, a clear-field reticle, a dark-field reticle, a binary reticle, a phase-shift mask (PSM), an alternating PSM, an attenuated or halftone PSM, and a ternary attenuated PSM. A clear-field reticle has field or background areas that are transparent, and a dark-field reticle has field or background areas that are opaque. A binary reticle is a reticle having patterned areas that are either transparent or opaque. Binary reticles are different from phase-shift masks (PSM), one type of which may include films that only partially transmit light, and these reticles may be commonly referred to as halftone or embedded phase-shift reticles. If a phase-shifting material is placed on alternating clear spaces of a reticle, the reticle is referred to as an alternating PSM, an ALT PSM, or even a Levenson PSM. One type of phase-shifting material that is applied to arbitrary layout patterns is referred to as an attenuated or halftone PSM, which may be fabricated by replacing the opaque material with a partially transmissive or "halftone" film. A ternary attenuated PSM is an attenuated PSM that includes completely opaque features as well.

A reticle, as described herein, may or may not include a pellicle, which is an optically transparent membrane that seals off the reticle surface from airborne particulates and other forms of contamination. The term reticle may also be used to refer to a reticle that includes optical proximity correction (OPC) features. OPC features are designed to reduce distortions of an image printed using the reticle by reducing optical proximity effects. The term "optical proximity effects" generally refers to variations in lateral dimensions or shapes of printed features due to the proximity of other features on the reticle. Such effects may be reduced by determining the distortions due to the optical proximity effects and altering the features on the reticle to compensate for such distortions.

Resolution enhancement technologies (RET) such as OPC and Phase Shift Masks (PSM) are increasingly being applied to integrated circuit (IC) designs in order to print features on device wafers which are smaller than the wavelength of light used as the exposure source. These RETs often involve the addition of extra features to the design including sub-resolution assist features (SRAF) and serifs with the result that the layout of the design on the photomask or reticle becomes extremely complex. Verifying that the RET features will print correctly on the reticle and that the SRAFs will not print on the wafer but will cause the main features to print correctly on the wafer is becoming an increasingly difficult task. Furthermore, optical effects such as mask error enhancement factor (MEEF) may cause additional distortion of the final image at the wafer level. MEEF may be generally defined as the ratio of the critical dimension of a feature printed in a resist to the critical dimension of a structure formed on a reticle.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, and a conductive material. A "resist" may include any material that may be patterned by an optical lithography technique, an e-beam lithography technique, or an X-ray lithography technique. Examples of a dielectric material may include, but are not limited to, silicon dioxide, silicon nitride, silicon oxynitride, and titanium nitride. Additional examples of a dielectric material include "low-k" dielectric materials such as Black Diamond™ which is commercially available from Applied Materials, Inc., Santa Clara, Calif., and CORAL™ commercially available from Novellus Systems, Inc., San Jose, Calif., "ultra-low k" dielectric materials such as "xerogels," and "high-k" dielectric materials such as tantalum pentoxide. In addition, examples of a conductive material include, but are not limited to, aluminum, polysilicon, and copper.

One or more layers formed on a wafer may be patterned. For example, a wafer may include a plurality of dies, each having repeatable pattern features. Formation and processing of such layers of material may ultimately result in completed semiconductor devices. As such, a wafer may include a substrate on which not all layers of a complete semiconductor device have been formed or a substrate on which all layers of a complete semiconductor device have been formed. The term "semiconductor device" is used interchangeably herein with the term "IC." In addition, other devices such as microelectromechanical (MEMS) devices and the like may also be formed on a wafer.

Turning now to the drawings, FIG. 1 illustrates one example of a method, of which one or more steps may be performed according to the embodiments described herein. It is noted that the steps shown in FIG. 1 are not essential to practice of the method. One or more steps may be omitted or added to the method illustrated in FIG. 1, and the method can still be practiced within the scope of this embodiment.

The method shown in FIG. 1 generally illustrates various steps that may be performed using reticle layout data 10. Reticle layout data 10 may be generated in any manner known in the art. The reticle layout data defines the structures that will be printed on a wafer to form a semiconductor device such as an IC. Therefore, the reticle layout data also defines the structures that will be printed on a reticle that will be used to print wafers.

Different regions of the reticle layout data will have different electrical significance as described in U.S. Pat. Nos. 6,529,621 to Glasser et al. and 6,748,103 to Glasser et al., which are incorporated by reference as if fully set forth herein. For example, regions of the reticle layout data that include transistor structures may be deemed electrically critical while regions of the reticle layout data that include interconnect structures may be deemed electrically non-critical.

Figure 2:
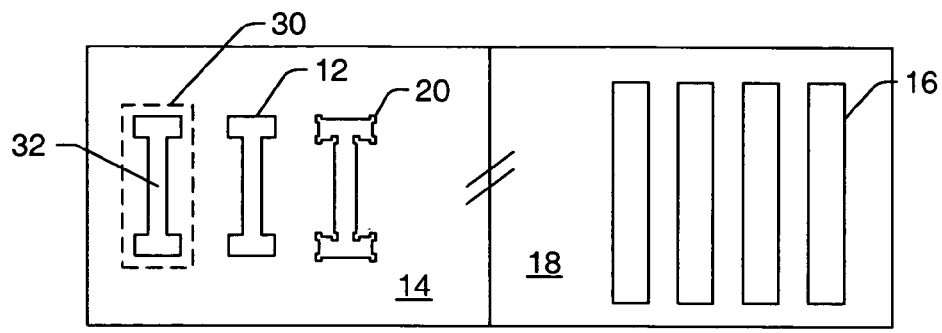
FIG. 2 is a plan view illustrating one example of different regions of reticle layout data.

Different regions of the reticle layout data will also have different printability characteristics. For example, some regions of the reticle layout data will include features that are more difficult to print on a reticle than features in other regions of the reticle layout data. FIG. 2 illustrates examples of two such regions. Features 12 in region 14 of the reticle layout data are gate structures for transistors. The smallest dimensions that will be printed with the reticle are usually the dimensions of the gate structures since the width of the gate will largely determine the speed of the transistor. Therefore, features 12 will typically have smaller dimensions on the reticle than other features that will be printed with the reticle such as features 16 in region 18, which may be test structures, or other features such as interconnect structures.

In addition, due to the importance of the gate structures in determining the properties of the transistors and the IC, the gate structures that will be printed on the reticle may also include SRAFs 20, which may be configured as described above, to improve the dimensions and shape of the gate structures that will be printed on a wafer. Since the SRAFs are designed to have dimensions that are below the resolution of the lithography system that will be used to print the reticle layout data on the wafer, the SRAFs may be among the smallest features that will be fabricated on the reticle. Therefore, gate structures, and particularly gate structures that include SRAFs, are also usually among the most difficult structures to print in the reticle layout data. Although gate structures are also electrically significant and, therefore, would be determined to be critical by the designer intent methods described above, it is to be understood that not all electrically significant features will also have printability significance and vice versa.

Due to the difficulty in printing SRAFs and structures containing SRAFs, the SRAFs may produce more printing defects on a reticle than other structures on the reticle. A "printing defect" as used herein refers to a defect in a printed structure on a reticle (or a wafer in another context) such as excessive corner rounding, unsatisfactory dimensions, etc. In addition, the process window (or the range of process parameters) in which the SRAF structures can be satisfactorily printed may be narrower than for other structures including non-SRAF containing structures. However, it may be desirable to inspect SRAF structures with a lower sensitivity than other non-SRAF structures since they don't print on a wafer, but are used to improve the process window. Furthermore, SRAFs are difficult to both inspect and manufacture and would thus make many nuisance defects unless desensed.

The embodiments of the methods described herein include identifying different regions (e.g., a first region and a second region) in reticle layout data that have different printability. For example, a printability of region 14 will most likely be more sensitive to changes in process parameters than a printability of region 18 as described above. In other words, region 14 will more likely print imperfectly than region 18. In some embodiments, the printability of the regions in the reticle layout data is the printability of the regions on a reticle. In such an embodiment, the process parameters to which the sensitivity of the printability is determined may include reticle manufacturing parameters. In other embodiments, the printability of the regions in the reticle layout data is the printability of the regions on a wafer. In these embodiments, the process parameters that are used to determine printability sensitivity include reticle manufacturing process parameters (since the wafer printability will depend on the reticle printability) in addition to wafer manufacturing process parameters. Therefore, the methods described herein can be used to automatically define or create different regions having critical or non-critical printability in reticle layout data unlike other methods for defining different regions in reticle layout data which are based on electrical significance and are performed manually.

It is to be understood that the terms "first" and "second" as used herein are not intended to imply any temporal, spatial, or sequential qualities of the regions in the reticle layout data. Instead, the terms "first" and "second" are used merely to indicate different regions in the reticle layout data having different printing sensitivities as described herein. In addition, it is to be understood that any other suitable terms may be used to indicate different regions in reticle layout data as defined herein.

Figure 3:
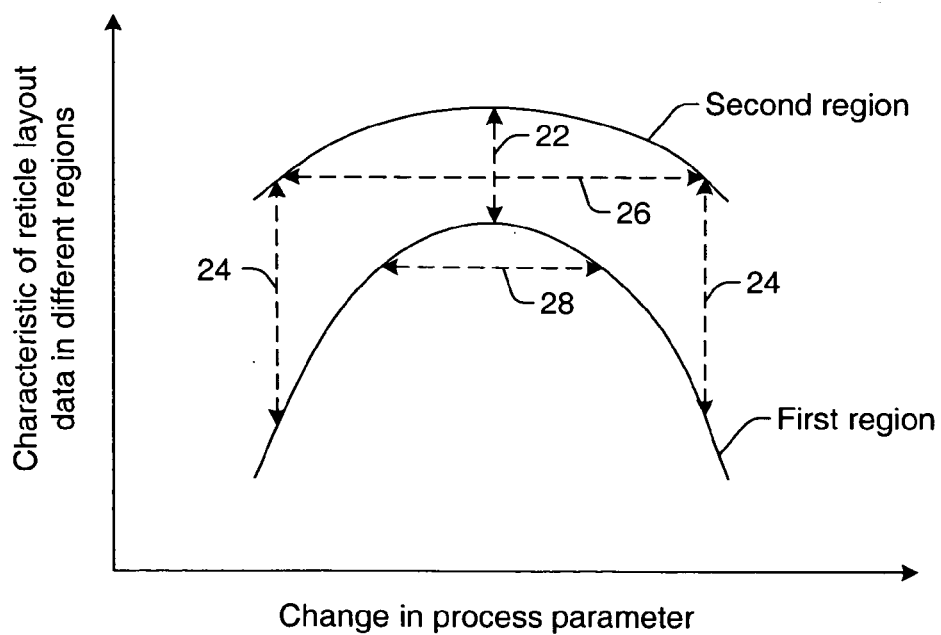
FIG. 3 is a plot illustrating one example of how different regions of reticle layout data can have different printability sensitivities and different process windows.

One example of the differences in printability sensitivity of different regions in reticle layout data is illustrated in FIG. 3. As shown in FIG. 3, a characteristic of reticle layout data in a first region, such as region 14 shown in FIG. 2, as printed on a reticle varies as a function of the change in a process parameter. The characteristic that is plotted in FIG. 3 may include any characteristic of interest such as width, height, corner rounding or any other characteristic that is known to change with process parameters in a measurable manner. The characteristic that is plotted in such a figure may alter the shape of the plot. For example, the plot shown in FIG. 3 may be of feature height printed on a reticle. In this manner, the highest feature height may indicate the minimum amount of thickness loss and the optimum process parameter for reducing shrinkage, and the shrinkage in the features increases as the process parameters move farther away from the optimum process parameter. Although the plots shown in FIG. 3 are illustrated to have a maximum and exhibit symmetry on either side of the maximum, it is to be understood that the plots may have any shape, which will be determined by how the characteristic of the printed features of the reticle layout data change as a function of process parameter.

The process parameter that is plotted along the x-axis of the graph shown in FIG. 3 may be any process parameter that is known to cause changes in the printed features of reticle layout data such as exposure dose, exposure focus, etc. In addition, more than one such plot for reticle layout data may be generated for different characteristics and/or different process parameters. Furthermore, different plots may be generated to illustrate changes in a characteristic of features in the reticle layout data that will be printed on a reticle or a wafer as a function of process parameter. Obviously, the process parameter may change depending on whether the reticle printability or the wafer printability is being evaluated.

As further shown in FIG. 3, a characteristic of the reticle layout data in a second region, different than the first region, such as region 18 shown in FIG. 2 as printed on a reticle also varies as a function of the change in the process parameter. The characteristic of the second region shown in FIG. 3 is the same as the characteristic of the first region that is shown in FIG. 3 such that a direct comparison between the two regions for one characteristic can be made using the plots. As shown in FIG. 3, the characteristics of the first and second regions are offset from one another. This offset may be caused by the different characteristics that the different regions are designed to have. However, the first and second regions may not necessarily be offset from one another, and some portion of the plot for the first and second regions may be superimposed on each other and/or intersect at one or more points.

In any case, the plots shown in FIG. 3 illustrate that different regions on the reticle layout data can have characteristics that vary in different ways and to different degrees as a function of change in process parameter. For example, as shown in FIG. 3, both of the plots exhibit minimum shrinkage at approximately the same process parameter as shown by arrow 22 (although the optimum process parameter for the same characteristic of different regions of the reticle layout data may be different). In addition, as shown by arrows 24, as the process parameter moves farther away from the optimum process parameter, the characteristic of the first region changes much more dramatically than the characteristic of the second region. Therefore, the printability of the first region is more sensitive to changes in the process parameter than the printability of the second region.

As a result in some instances, the process window for the first region will be smaller, and even dramatically smaller, than that of the second region. For example, as shown by arrow 26, the process window of the second region, which includes values of the process parameter that will produce printed features in the second region having acceptable values for the characteristic, is relatively large (e.g., encompassing almost all of the process parameters that were evaluated). In contrast, the process window of the first region as shown by arrow 28 is substantially smaller than that of the second region, which, in this instance, is a direct consequence of the dramatic changes in the characteristic of the printed features in the first region as a function of change in process parameter. In other words, the printability of the first region is more sensitive to changes in the process parameter in that the first region has a narrower process window than the second region.

As described above, therefore, the sensitivity of the printability of a region in reticle layout data may be based on characteristics of the reticle layout data itself (e.g., dimensions) and/or estimates of the process window for the reticle layout data. However, the sensitivity of the printability of the reticle layout data may also be determined based on the MEEF of the reticle layout data. For example, regions of the reticle layout data having a relatively high MEEF may have a printability that is more sensitive to changes in one or more process parameters than regions of the reticle layout data having a relatively low MEEF. In addition, the sensitivity of regions in the reticle layout data may be determined using one of these indicators (e.g., characteristic(s), process window, MEEF) of printability sensitivity or a combination of these indicators. Furthermore, the sensitivity of the printability of different regions in the reticle layout data may be determined in any other manner known in the art.

As shown in FIG. 2, regions 14 and 18 include a number of features that have similar printability. The method may define individual regions as regions in the reticle layout data that include features having similar printability. Therefore, the size of the regions may vary greatly depending on, for example, the number of neighboring features that have similar printability, the size of those features, and the spacing between those features.

However, the method may be configured to reduce or minimize the area of the regions defined in the reticle layout data. In this manner, the regions in the reticle layout data may be defined with "micro-sensitivity." For example, the method may be configured to designate each feature as a separate region. In one such example, region 30 in the reticle layout data may have an area that is approximately equal to an area of feature 32 in the reticle layout data. In another example, a region may be defined as only a portion of a feature. In such an example, a region in the reticle layout data may have an area that is less than an area of a feature in the reticle layout data. In addition, one feature may be composed of a number of different regions, each having different or independent printability sensitivity.

Regions that have different printability sensitivity may be treated differently. For example, as described in embodiments herein, regions that have different printability may be simulated with different simulation parameters, inspected with different inspection parameters, and/or reviewed with different review parameters.

In particular, the method may include simulating how the reticle layout data will print, as shown in step 34 of FIG. 1. The simulation may be performed to determine how the reticle layout data will print on a reticle. Therefore, a model describing a reticle manufacturing process may be used to simulate how the reticle layout data will print. In addition, or alternatively, the simulation may be performed to determine how the reticle layout data will print on a wafer. Therefore, a model describing a reticle manufacturing process and a model describing a wafer manufacturing process (including a resist model) may be used to simulate how the reticle layout data will print.

According to one embodiment, simulation of regions of the reticle layout data having different printability may be simulated with different simulation parameters. Preferably, the regions that have more sensitive printability will be simulated with simulation parameters that produce a higher fidelity simulation than for other regions having less sensitive printability. The fidelity of the simulation may be adjusted from region-to-region in the reticle layout data in a number of ways. For example, the fidelity may be increased by increasing the number of pixels that are used for simulation. The fidelity may also be lowered by changing the number of pixels. In this manner, the simulation parameter(s) for simulation of a first region having a more sensitive printability than a second region may include a larger number of pixels. In addition, the simulation may be performed at various process parameters (e.g., reticle manufacturing parameters and/or wafer manufacturing parameters) to estimate how the features in the region will print with different process parameters or across a range of process parameters. Therefore, another way to increase the fidelity of the simulation would be to use a higher sampling of the different process parameters for regions of the reticle layout data having more sensitive printability than for other regions having less sensitive printability. The fidelity of the simulation may be altered in any other manner known in the art.

Figure 4:
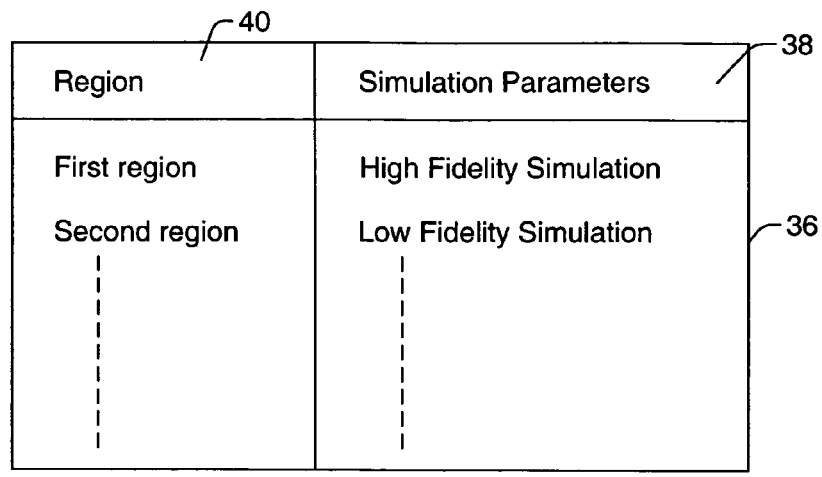
FIG. 4 illustrates one example of a database structure that can be used to assign different simulation parameters to different regions of reticle layout data.

FIG. 4 illustrates one example of a database structure that can be used to assign and store simulation parameters for different regions of reticle layout data. In addition, FIG. 4 illustrates content of the database structure that may be used to represent the parameters for a simulation of the reticle layout data. Database structure 36 is shown to include simulation parameters 38 assigned to regions 40 in the reticle layout data. Although only two regions are shown in database structure 36, it is to be understood that such a database structure may include simulation parameters for more than two regions or all regions in the reticle layout data.

The first and second regions shown in FIG. 4 correspond in this example to the first and second regions shown in FIG. 2. As such, the first region has a more sensitive printability than the second region. As shown in FIG. 4, the simulation parameters assigned to each of the regions may be different such that different regions can be simulated with different fidelity. In particular, simulation parameters are assigned to the first region such that the first region may be simulated with relatively high fidelity. The fidelity of the simulation may be altered as described above. In addition, as shown in FIG. 4, the fidelity of the simulation assigned to different regions may be indicated in the simulation parameters column of the database structure, and the actual simulation parameters (e.g., number of pixels, etc.) to be used for each different fidelity may be defined in another database structure (not shown). Alternatively, the individual parameters that define a high, low, or other fidelity simulation may be included in database structure 36. As further shown in FIG. 4, simulation parameters are assigned to the second region such that the second region may be simulated with relatively low fidelity. Other differences in the simulation to be performed for the different regions may also be included in database structure 36 or may be included in a different, separate database structure (not shown).

It may be desirable to simulate how all of the reticle layout data for one reticle (i.e., an entirety of the reticle layout data) will print in step 34. Obviously, such simulations would require significant computational resources and time, and the computational load for such simulations can be burdensome. However, using critical printability feature regions as described above to direct such a simulation would allow the computation to progress much more efficiently. In particular, the sensitivity of the printability of each region that makes up all of the reticle layout data can be determined as described above, and the fidelity of the simulation may be altered as described above from region-to-region in the reticle layout data thereby substantially reducing the computational resources and time needed for the simulation without reducing the usefulness or meaningfulness of the simulation results since those regions having sensitive printability will be simulated with higher fidelity than non-sensitive regions.

The simulation results of step 34 may also be used in the inspection of the reticle layout data shown in step 44. Inspecting the reticle layout data includes detecting printing defects that will be produced by the different regions of the reticle layout data. For example, the method may include detecting printing defects that will produced by the reticle layout data based on the simulation. In addition, the inspection of the reticle layout data may include determining which features in the reticle layout data will produce printing defects on a reticle. For example, the inspection may involve comparing the simulation of the features of the reticle layout data to specifications for the features set by the IC designer or the IC manufacturer. In one such example, the dimensions of the simulated features may be compared to a range of dimensions specified for the feature printed on the reticle by the IC designer.

The inspection may also involve any other method for determining printing defects on a reticle such as design rule checks. In another example, the simulated reticle data may be compared to data taken from an aerial sensor such as that described in co-owned, co-pending U.S. patent application Ser. No. 10/679,857 filed Oct. 6, 2003 by Stokowski et al., which is incorporated by reference as if fully set forth herein. Alternatively, the simulated reticle data could be compared to an aerial image sensor of the type described in U.S. Pat. No. 6,803,554 to Ye et al. and 6,807,503 to Ye et al. and U.S. Patent Application Publication No. U.S. 2003/0226951 by Ye et al., which is incorporated by reference as if fully set forth herein.

In addition, the inspection may be performed differently for different regions on the reticle. For example, for regions on the reticle that have a relatively sensitive printability, the threshold that is used in identifying defects in the reticle layout data may be set to a lower value (or closer to the target value) than for regions on the reticle that have relatively insensitive printability. In other words, printing defects may be detected in the regions having sensitive printability with lower tolerances for variations in the features. Likewise, printing defects may be detected in the regions having less sensitive printability with higher tolerances for variations in the features. In this manner, the inspection may be performed in a manner in which one or more inspection parameters are altered from region-to-region on the reticle depending on the sensitivity of the printability of each region. In particular, the regions that have a printability that is more sensitive to changes in the process parameters than other regions in the reticle layout data may be inspected with a higher sensitivity that the other regions. As a result, the inspection of the reticle layout data can detect defects in the reticle layout data that will be of importance to the user.

As shown in step 42, the method may include generating an inspection process. The inspection process may be generated based on the reticle layout data. In particular, the inspection process may be generated based on the printability of different regions in the reticle layout data. For example, a computer-implemented method for generating a process for inspecting reticle layout data includes identifying different regions in the reticle layout data as described above and assigning one or more inspection parameters to the different regions. In particular, the inspection parameter(s) may be assigned such that different regions are inspected with different sensitivities. For example, the inspection parameter(s) may be assigned such that the first region as described above will be inspected during the process with a higher sensitivity than the second region. The different regions may be assigned different parameters such as threshold value as described above or any other inspection parameter that can be varied known in the art. The inspection process that is generated in step 42 may then be used in step 44 for inspection of the reticle layout data.

Figure 5:
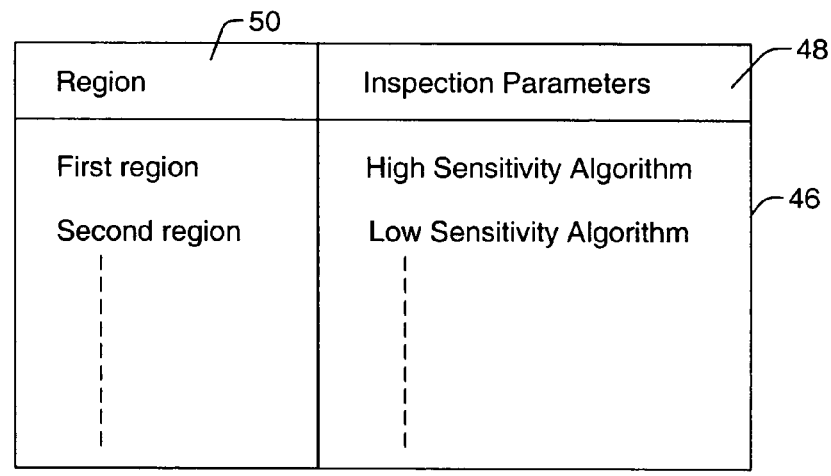
FIG. 5 illustrates one example of a database structure that can be used to assign different inspection parameters to different regions of reticle layout data.

Generating the inspection process may include generating a database structure such as that shown in FIG. 5. FIG. 5 illustrates one example of a database structure that can be used to assign and store inspection parameters for different regions of reticle layout data. In addition, FIG. 5 illustrates content of the database structure that may be used to represent the parameters for inspection of the reticle layout data. Database structure 46 is shown to include inspection parameters 48 assigned to regions 50 in the reticle layout data. Although only two regions are shown in database structure 46, it is to be understood that such a database structure may include simulation parameters for more than two or all regions in the reticle layout data.

The first and second regions shown in FIG. 5 correspond in this example to the first and second regions shown in FIG. 2. As shown in FIG. 5, the inspection parameters assigned to each of the regions may be different such that different regions can be inspected with different sensitivity. In particular, inspection parameters are assigned to the first region such that the first region may be inspected with relatively high sensitivity. The sensitivity of the inspection may be altered as described above. For example, the sensitivity may be altered by using different algorithms (e.g., a high sensitivity algorithm or a low sensitivity algorithm) as shown in FIG. 5. The sensitivity of the inspection process may be altered in other ways (e.g., changing the threshold value used to detect defects in the reticle inspection data). In addition, as shown in FIG. 5, the inspection parameters (e.g., a particular algorithm, etc.) to be used for the particular sensitivity may be defined in the inspection parameters column. Alternatively, the sensitivity of the inspection may be indicated in the inspection parameters column of the database structure, and these parameters may be indicated in a different database structure. As further shown in FIG. 5, inspection parameters are assigned to the second region such that the second region may be inspected with low sensitivity. Other differences in the inspection to be performed for each region may also be included in database structure 46 or may be included in a different, separate database structure (not shown).

The inspection of the reticle layout data is preferably performed prior to manufacturing of a reticle with the reticle layout data. In this manner, defects in the reticle layout may be corrected prior to manufacturing the reticle, which is both time consuming and expensive. For example, as shown in FIG. 1, the method may also include altering the reticle layout data, as shown in step 52. Altering the reticle layout data may be based on results on the simulation and/or results of the inspection. Altering the reticle layout data is preferably performed to reduce the number of printing defects that will be formed on a reticle if the reticle layout data is printed on the reticle. In addition, altering the reticle layout data may involve altering one or more characteristics of one or more features in the reticle layout data to reduce the sensitivity of the printability of the reticle layout data. For example, one or more characteristics of the SRAFs of a feature in the reticle layout data may be altered such that the feature can be printed on the reticle within acceptable limits and/or across a broader range of process parameters thereby increasing the printability of the feature. After alteration of the reticle layout data, simulation of the altered reticle layout data, generation of an inspection process for the altered reticle layout data, and inspection of the altered reticle layout data may again be performed as described above.

The method may also include reviewing the reticle layout data, as shown in step 54. Reviewing the reticle layout data may include review of features or regions in the reticle layout data that will produce printing defects as determined by inspection performed in step 44. Review of the reticle layout data may involve displaying various information about the defective portions of the reticle layout data to a user such that the user can make decisions about the defective portions. In this manner, the review may involve manual review. The information that is displayed to the user may include simulation results, inspection results, actual reticle layout data, or any other information about the reticle layout data that is available and will aid in user understanding of the defective portions of the reticle layout data. The user may make decisions about the defective portions such as to ignore a defective portion (i.e., to indicate that the defective portion is acceptable), to indicate that a defective portion should be altered (e.g., to make the portion acceptable), to indicate that additional simulation of a defective portion should be performed, etc.

Alternatively, the method may include automatic review of the reticle layout data or semi-automatic review of the reticle layout data in which similar decisions about the defective portions may be made. Results of the review may also be used to alter the reticle layout data, which may be performed as described above. In addition, results of the review may be used to alter the generated inspection process or the method in which the inspection process is generated (e.g., to produce a more accurate or more sensitive inspection process).

Figure 6:
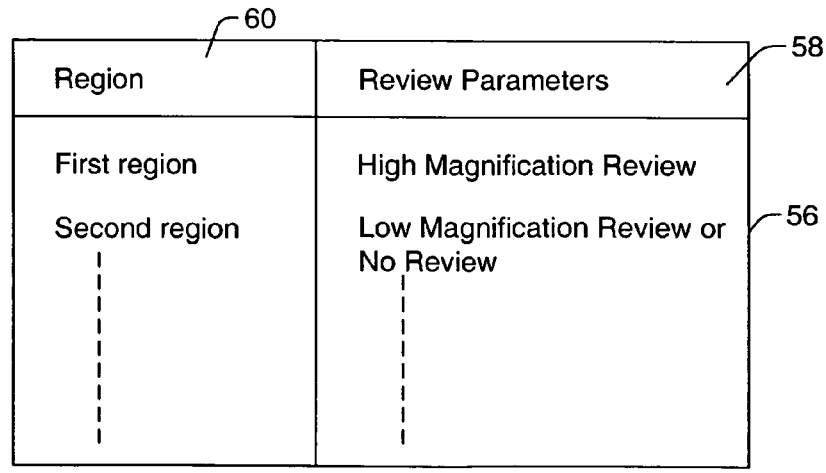
FIG. 6 illustrates one example of a database structure that can be used to assign different review parameters to different regions of reticle layout data.

The methods described herein, in some embodiments, may also include generating a review process for the reticle layout data (not shown). Generating the review process may include assigning one or more review parameters to first and second regions, as defined above, such that the first region will be reviewed during the review process with a higher sensitivity than the second region. Generating the review process may also include generating a database structure such as that shown in FIG. 6. FIG. 6 illustrates one example of a database structure that can be used to assign and store review parameters for different regions of reticle layout data. In addition, FIG. 6 illustrates content of the database structure that may be used to represent the parameters for review of the reticle layout data. Database structure 56 is shown to include review parameters 58 assigned to regions 60 in the reticle layout data. Although only two regions are shown in database structure 56, it is to be understood that such a database structure may include review parameters for more than two or all regions in the reticle layout data.

The first and second regions shown in FIG. 6 correspond, in this example, to the first and second regions shown in FIG. 2. As shown in FIG. 6, the review parameters assigned to each of the regions may be different such that different regions can be reviewed with different magnifications or other review parameter(s). In particular, in this example, review parameters are assigned to the first region such that the first region may be reviewed with high magnification. The magnification of the review may be altered, for example, by altering one or more parameters of an optical review tool. The magnification may also be altered by changing the review tool that is used to review a region in the reticle layout data (e.g., from an optical review tool to an e-beam review tool). In addition, as shown in FIG. 6, the sensitivity, or magnification, of the review may be indicated in the review parameters column of the database structure, and the actual review parameters to be used for the particular review may be defined in another database structure (not shown). Alternatively, the individual parameters that define a high or low sensitivity review may be included in database structure 56. As further shown in FIG. 6, review parameters are assigned to the second region such that the second region may be inspected with low magnification or such that the second region is not reviewed at all. Other differences in the review to be performed for each region may also be included in database structure 56 or may be included in a different, separate database structure (not shown).

As described above, therefore, the method may involve a number of steps that can be performed in an iterative manner to produce reticle layout data that will print on a reticle in an acceptable manner. In similar manner, the above described steps may be performed to determine how the reticle layout data will print on a wafer. For example, the simulation step described above may be altered such that the simulation uses not only a reticle manufacturing model but also a wafer printing model (which may include a number of models such as a lithography process model and a resist model). Other steps described above may be altered in a similar manner. In this manner, the printing defects that will be produced on a wafer by the reticle layout data may be determined, and the reticle layout data may be altered to reduce the number of printing defects that will be printed on the wafer.

After it has been determined that the reticle layout data (altered or not) will print in an acceptable manner (on a reticle and/or a wafer), a reticle may be manufactured with the reticle layout data, as shown in step 62. A process for manufacturing a reticle is similar to a wafer patterning process. For example, the goal of reticle manufacturing is generally to form a pattern in an opaque material such as a relatively thin chrome layer on a substantially transparent substrate such as glass. In addition, other appropriate opaque materials that may be used for reticle manufacturing include, but are not limited to, chromium, chromium oxide, chromium nitride, and molybdenum/silicon. Appropriate thicknesses for chrome layers may be approximately 1000 Å and may be deposited upon a glass substrate by sputtering. Additional appropriate transparent materials that may be used for reticle manufacturing include borosilicate glass or fused-silica ($SiO_2$, "quartz"), which have relatively stable dimensions and transmission properties for wavelengths of exposure systems. Additional materials may also be used for reticle manufacturing. For example, a film underlying an opaque material may act as an adhesion layer. Such an adhesion layer may include, for example, a mixture of chromium, nitrogen, and oxide. In addition, a film formed on top of the opaque material may act as an anti-reflective layer. An appropriate anti-reflective layer may be formed of, for example, a relatively thin layer of chromium oxide ($Cr_2O_3$).

Reticle manufacturing may include a number of different steps such as pattern generation. Alternatively, reticles may be made with laser or e-beam direct write exposure. Laser exposure allows the use of standard optical resists and is faster than e-beam direct write exposure. In addition, laser systems are also less expensive to purchase and operate. Direct write laser sources are turned on and off with an acousto-optical modulator (AOM). An example of a commercially available direct write laser system is the ALTA 3000® laser writer available from ETEC Systems, Inc., Hayward, Calif. Direct write e-beam systems are often used to manufacture complex reticles since they produce finer line resolution than laser systems. In addition, direct write e-beam systems can also write larger die sizes than laser systems. Examples of commercially available direct write e-beam systems include the MEBES 4500 and 5000 systems available from ETEC Systems, Inc. The reticle manufacturing may also include steps like etch to transfer the pattern from a resist on the reticle to an underlying material (e.g., the opaque material or the transparent material).

Regardless of the actual process parameters used to fabricate the reticle, the result of reticle fabrication will be reticle layout data printed on a reticle, as shown in step 64. A number of steps may then be performed on the reticle prior to using the reticle to form patterned wafers. For example, as shown in step 66, the method may include inspecting the reticle layout data printed on the reticle. Unlike the inspection that is performed in step 44, this inspection can be performed using measurements performed on the actual, fabricated reticle. For example, the reticle can be inspected in step 66 optically or with an e-beam based tool.

Like the inspection that is performed in step 44 on the reticle layout data, the inspection performed in step 66 on the reticle may have one or more inspection parameters that are altered from region-to-region on the reticle. For example, based on the printability sensitivity of different regions on the reticle, which may be determined as described above, one or more parameters of the inspection of the reticle may be varied across the reticle. The one or more inspection parameters that are altered in step 66 may include any inspection parameter that can alter the sensitivity with which defects are detected on the reticle (e.g., threshold). In addition, the inspection that is performed on the reticle may involve detecting printing defects on the reticle and non-printing defects on the reticle (e.g., particulate contamination, scratches, etc.).

The method may also include reviewing the reticle layout data printed on the reticle, as shown in step 68. Reviewing the printed reticle layout data may be performed as described above (e.g., manually, automatically, or semi-automatically). In addition, one or more parameters of the review process may be altered depending on the printability sensitivity of different regions of the reticle layout data as described above. However, unlike the methods described above, the review that is performed in step 68 is review of the reticle layout data actually printed on the reticle. Therefore, the review of the printed reticle layout data may include gathering additional information about the printed reticle layout data. For example, the printed reticle layout data on the reticle may be examined using a reticle review tool. The reticle review tool may be a high magnification optical tool and/or an electron beam tool. The reticle review tool may be generally configured to generate additional information or more detailed information about defects detected on the reticle in step 66.

The results of inspection and review of the printed reticle layout data may be used to determine further processing of the reticle. For example, if printing defects are detected in regions of the reticle having relatively sensitive printability, it may be decided that these printing defects should be repaired. Defect repair processing of the reticle may be performed using, for example, a focused ion beam (FIB) repair tool or any other suitable repair tool known in the art. In addition, individual defects on the reticle may be repaired one at a time or collectively (e.g., multiple defects repaired simultaneously). It may also be determined if the reticle should be cleaned. Cleaning may be performed if a relatively large number of defects such as particulate defects are found on the reticle. In addition, based on the results of inspection and review, it may be determined if the reticle can be reworked (e.g., reprocessed to remove the results of one or more process steps and to repeat these process steps with hopefully better results) or if the reticle should be scrapped (i.e., disposed of).

If the printed reticle layout data passes inspection and review, a wafer may be manufactured with the reticle, as shown in step 70. Manufacturing the wafer in general may include one or more (or even many) steps before the reticle is used to pattern the wafer. However, manufacturing the wafer with the reticle will generally involve a lithography process in which a resist is formed on the wafer, and the pattern printed on the wafer is transferred to the resist by projecting light through the reticle and onto the resist and then processing the resist (usually through exposure to a chemical solution). The pattern on the reticle may alternatively be transferred to the resist in a non-optical manner (e.g., using x-rays with x-ray lithography).

One or more parameters of the lithography process (optical and/or non-optical parameters) may be varied depending on the printability sensitivity of different regions on the reticle. For example, based on the region-to-region sensitivity of the reticle layout data determined as described above, one or more parameters of the lithography process (e.g., exposure and/or dose) may be varied from region-to-region on the wafer. Ideally, the one or more parameters of the lithography process will be varied to increase the accuracy with which the regions having sensitive printability are printed on the wafer. Therefore, the method may include generating the lithography process used to manufacture the wafer (not shown) based on the sensitivity of the printability of different regions on the reticle. In addition, parameters of other patterning processes (e.g., etch) performed on the wafer may also be varied from region-to-region based on the sensitivity of the printability of the different regions. The parameters of reticle manufacturing may be varied in a similar manner from region-to-region.

As shown in step 72, the result of wafer manufacturing with the reticle will be reticle layout data printed on the wafer. A number of processes may be performed on the wafer before additional wafer manufacturing processes are performed on the wafer. For example, as shown in step 74, the method may include inspecting the reticle layout data printed on the wafer. The reticle layout data printed on the wafer may be inspected using any method known in the art (optical, non-optical, e-beam, scatterometry, ellispometry, reflectometry, etc.). One or more parameters of the wafer inspection may be varied from region-to-region on the wafer depending on the sensitivity of the different regions on the wafer. The sensitivity of the different regions on the wafer may be determined as described above based on the sensitivity of the different regions of the reticle layout data that correspond to the regions on the wafer. The one or more parameters of the wafer inspection process that are varied may include any parameter that may alter the sensitivity of the wafer inspection (e.g., threshold value). The method may also include generating the wafer inspection process in which different inspection parameters are assigned to different regions of the wafer.

As shown in step 76, the method may also include reviewing the reticle layout data printed on the wafer. Reviewing the reticle layout data printed on the wafer may be performed as described above (e.g., manually, automatically, or semi-automatically). In addition, one or more parameters of the wafer review process may be altered depending on the printability sensitivity of different regions of the reticle layout data as described above. However, unlike the methods described above, the review that is performed in step 76 is review of the reticle layout data actually printed on the wafer. Therefore, the review of the printed reticle layout data may include gathering additional information about the reticle layout data printed on the wafer. For example, the printed reticle layout data on the wafer may be examined using a wafer review tool. The wafer review tool may be a high magnification optical tool, an electron beam tool, or any other appropriate tool known in the art. The wafer review tool may be generally configured to generate additional information or more detailed information about defects detected on the wafer in step 74.

The method shown in FIG. 1 may also include any other steps described herein. In addition, the method shown in FIG. 1 may also include any other steps known in the art such as completing device manufacturing on the wafer and performing electrical testing on the manufactured devices.

Program instructions implementing methods such as those described herein may be transmitted over or stored on a carrier medium. The carrier medium may be a transmission medium such as a wire, cable, or wireless transmission link, or a signal traveling along such a wire, cable, or link. The carrier medium may also be a storage medium such as a read-only memory, a random access memory, a magnetic or optical disk, or a magnetic tape.

The computer system may take various forms, including a personal computer system, mainframe computer system, workstation, network appliance, Internet appliance, personal digital assistant ("PDA"), television system or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Figure 7:
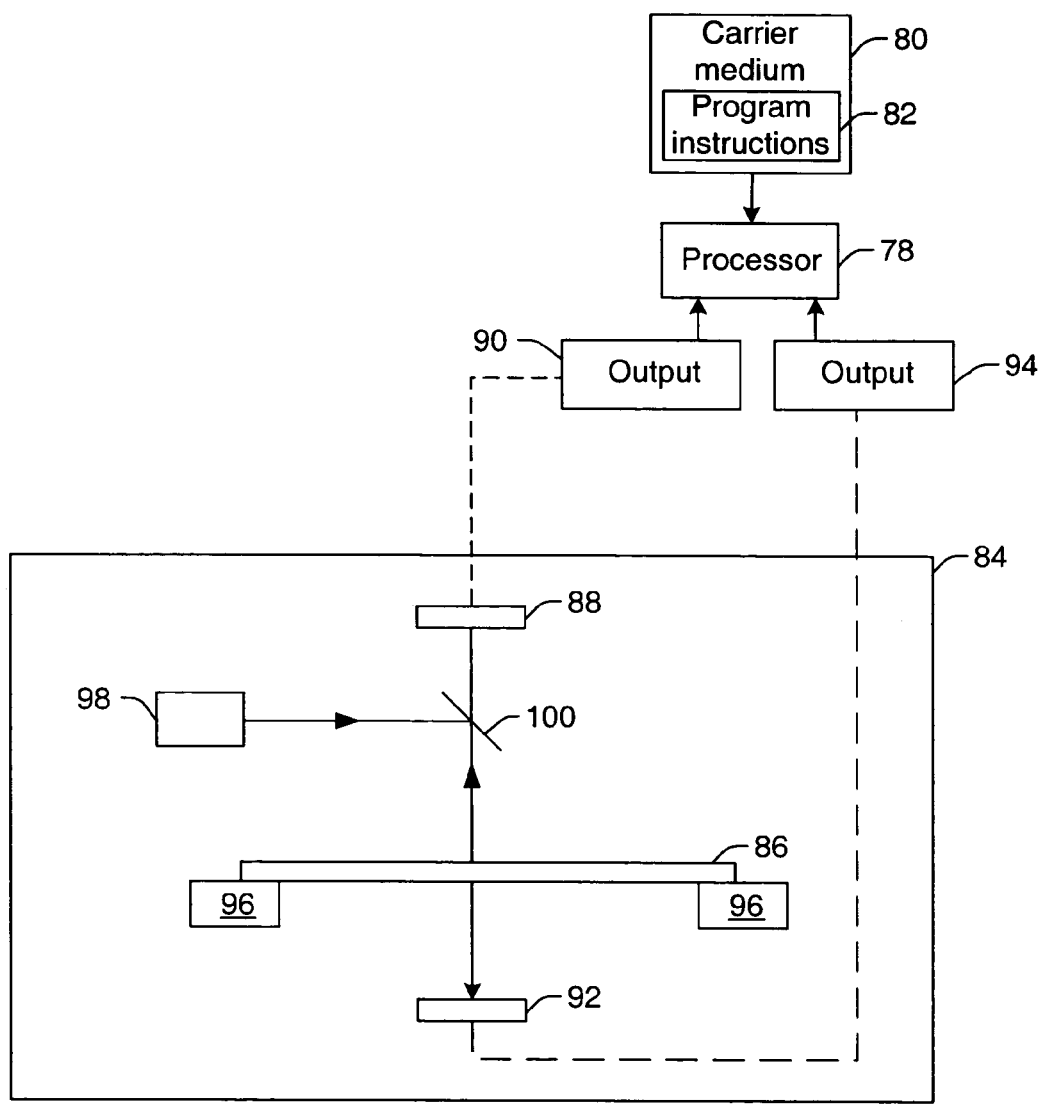
FIG. 7 is a schematic diagram illustrating a side view of one embodiment of a system that can be used to perform one or more of the computer-implemented methods described herein.

FIG. 7 illustrates one embodiment of a system that can be used to perform one or more steps of the methods described herein. The system includes a computer system. The computer system includes processor 78. The processor may include any suitable processor known in the art. For example, the processor may be an image computer or a parallel processor. The system may also include more than one processor (not shown). The system also includes carrier medium 80. The carrier medium may be configured as described above. For example, carrier medium 80 includes program instructions 82, which are executable on processor 78. The program instructions may be executable for performing any of the embodiments of the methods described above. The program instructions may be further configured as described above.

In some embodiments, the system may also include reticle inspection and/or metrology tool 84. Reticle inspection and/or metrology tool 84 may be configured to detect defects (not shown) on reticle 86 and/or to measure one or more characteristics of features (not shown) formed on reticle 86. Reticle inspection and/or metrology tool 84 may be coupled to processor 78. For example, one or more components of tool 84 may be coupled to processor 78 by a transmission medium (not shown). The transmission medium may include "wired" and "wireless" portions. In another example, detector 88 of tool 84 may be configured to generate output 90. The output may be transmitted across a transmission medium from detector 88 to processor 78. In addition, detector 92 of tool 84 may be configured to generate output 94, which may be transmitted across a transmission medium from detector 92 to processor 78. In some embodiments, output 90 and 94 may also be transmitted through one or more electronic components coupled between the detectors and the processor. Therefore, output 90 and 94 are transmitted from tool 84 to the processor. Output 90 and 94 may include, for example, inspection data and/or metrology data. Program instructions 82 may be executable on the processor to perform one or more of the computer-implemented methods described herein using output 90 and/or 94.

Reticle inspection and/or metrology tool 84 includes stage 96 upon which reticle 86 may be disposed during inspection and/or measurements. The stage may include any suitable mechanical or robotic assembly known in the art. Reticle inspection and/or metrology tool 84 also includes light source 98. Light source 98 may include any appropriate light source known in the art. In addition, the tool may include beam splitter 100, which is configured to direct light from light source 98 onto reticle 86 at angles that are approximately normal to an upper surface of reticle 86. The beam splitter may include any suitable beam splitter known in the art. Alternatively, the light source may be configured such that the light is directed at an oblique angle of illumination to the surface of reticle 86. Detector 88 is configured to detect light reflected from the upper surface of reticle 86 and transmitted by beam splitter 100. Detector 88 is also configured to generate output 90. Detector 92 is configured to detect light transmitted by reticle 86. Detector 92 also generates output 94. In this manner, tool 84 may be configured to detect defects on the reticle using reflected and/or transmitted light. The detectors may include any suitable detectors known in the art.

Although one general configuration of a reticle inspection and/or metrology tool is shown in FIG. 7, it is to be understood that the tool may have any suitable configuration known in the art. For example, the tool may include one of the 8250, 8250-R, or 8450 tools that are commercially available from KLA-Tencor. In addition, the tool may have various configurations such as optical imaging systems, ellipsometer-based systems, scatterometer-based systems or e-beam systems such as a CD SEM. Furthermore, tool 84 may be replaced with a different tool such as a wafer inspection tool, a reticle review tool, a wafer review tool, etc. The processor may also be coupled to more than one such tool.

Furthermore, although the processor of the computer system is shown in FIG. 7 coupled to a reticle inspection and/or metrology tool, it is to be understood that the computer system may be configured as a stand alone tool in another embodiment. For example, the computer system may include one or more components that are specifically designed (and optionally dedicated) to perform one or more of the methods described herein. The computer system may also be configured to perform any other method(s) described herein such as a method for simulating how the reticle layout data will print on a reticle and/or a wafer. In addition, the computer system may be coupled to a fab database such that the computer system can send and receive information from the fab database.

Further modifications and alternative embodiments of various aspects of the invention may be apparent to those skilled in the art in view of this description. For example, methods for simulating reticle layout data, inspecting reticle layout data, and generating a process for inspecting reticle layout data are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for generating a process for inspecting reticle layout data, comprising:
   identifying a first region in the reticle layout data, wherein a printability of the first region is more sensitive to changes in process parameters than a printability of a second region in the reticle layout data;
   assigning one or more inspection parameters to the first region and the second region such that the first region will be inspected during the process with a higher sensitivity than the second region;
   inspecting the first region with the higher sensitivity than the second region, wherein said inspecting is performed prior to manufacturing of a reticle with the reticle layout data; and
   altering the reticle layout data based on results of said inspecting.

2. The method of claim 1, wherein the printability of the first and second regions is the printability of the first and second regions on a reticle, and wherein the process parameters comprise reticle manufacturing process parameters.

3. The method of claim 1, wherein the printability of the first and second regions is the printability of the first and second regions on a wafer, and wherein the process parameters comprise reticle manufacturing process parameters and wafer manufacturing process parameters.

4. The method of claim 1, wherein the first region has an area approximately equal to an area of one feature in the reticle layout data.

5. The method of claim 1, wherein the printability of the first region is more sensitive to the changes in the process parameters in that the first region has a narrower process window than the second region.

6. The method of claim 1, wherein the printability of the first region is more sensitive to the changes in the process parameters in that the first region has a higher mask error enhancement factor than the second region.

7. The method of claim 1, further comprising generating a review process for the reticle layout data, wherein generating the review process comprises assigning one or more review parameters to the first region and the second region such that the first region will be reviewed during the review process with a higher sensitivity than the second region.

8. A computer-implemented method for inspecting reticle layout data, comprising:

identifying a first region in the reticle layout data, wherein a printability of the first region is more sensitive to changes in process parameters than a printability of a second region in the reticle layout data;

inspecting the first region with a higher sensitivity than the second region, wherein said inspecting is performed prior to manufacturing of a reticle with the reticle layout data; and altering the reticle layout data based on results of said inspecting.

9. The method of claim 8, wherein the printability of the first and second regions is the printability of the first and second regions on a reticle, and wherein the process parameters comprise reticle manufacturing process parameters.

10. The method of claim 8, wherein the printability of the first and second regions is the printability of the first and second regions on a wafer, and wherein the process parameters comprise reticle manufacturing process parameters and wafer manufacturing process parameters.

11. The method of claim 8, wherein the first region has an area approximately equal to an area of one feature in the reticle layout data.

12. The method of claim 8, wherein the printability of the first region is more sensitive to the changes in the process parameters in that the first region has a narrower process window than the second region.

13. The method of claim 8, wherein the printability of the first region is more sensitive to the changes in the process parameters in that the first region has a higher mask error enhancement factor than the second region.

14. The method of claim 8, wherein said inspecting comprises detecting printing defects that will be produced by the first and second regions of the reticle layout data.

15. The method of claim 8, further comprising determining how sensitive a printability of each region of the reticle layout data is to the changes in the process parameters, wherein said inspecting comprises inspecting said each region of the reticle layout data with a sensitivity based on the sensitivity of the printability of said each region.

16. A computer-implemented method for simulating reticle layout data, comprising:

identifying a first region in the reticle layout data, wherein a printability of the first region is more sensitive to changes in process parameters than a printability of a second region in the reticle layout data; and simulating how the reticle layout data will print, wherein simulation of the first region and the second region is performed with one or more different simulation parameters such that the first region is simulated with a higher fidelity than the second region.

17. The method of claim 16, wherein the printability of the first and second regions is the printability of the first and second regions on a reticle, and wherein the process parameters comprise reticle manufacturing process parameters.

18. The method of claim 16, wherein the printability of the first and second regions is the printability of the first and second regions on a wafer, and wherein the process parameters comprise reticle manufacturing process parameters and wafer manufacturing process parameters.

19. The method of claim 16, wherein said simulating comprises simulating how the reticle layout data will print with different process parameters, and wherein the one or more different simulation parameters comprise higher sampling of the different process parameters for the first region than for the second region.

20. The method of claim 16, wherein the one or more different simulation parameters comprise a larger number of pixels for the first region than for the second region.

21. The method of claim 16, further comprising detecting printing defects that will be produced by the reticle layout data based on said simulating.

22. The method of claim 16, further comprising altering the reticle layout data based on said simulating.

23. The method of claim 16, wherein said simulating comprises simulating an entirety of the reticle layout data.

\* \* \* \* \*